United States Patent
Souche et al.

(10) Patent No.: US 8,301,427 B2
(45) Date of Patent: Oct. 30, 2012

(54) FRACTURE NETWORK CHARACTERIZATION METHOD

(75) Inventors: Laurent Arnaud Souche, Abu Dhabi (AE); Josselin Kherroubi, Paris (FR); Matthieu Jean Rotschi, Gentilly (FR)

(73) Assignee: Schlumberger Technology Corporation, Sugar Land, TX (US)

( * ) Notice: Subject to any disclaimer, the term of this patent is extended or adjusted under 35 U.S.C. 154(b) by 670 days.

(21) Appl. No.: 12/479,086

(22) Filed: Jun. 5, 2009

(65) Prior Publication Data
US 2010/0312529 A1 Dec. 9, 2010

(51) Int. Cl.
G06G 7/48 (2006.01)

(52) U.S. Cl. .............................. 703/10; 703/2

(58) Field of Classification Search .................. 703/2, 10
See application file for complete search history.

(56) References Cited

U.S. PATENT DOCUMENTS

| | | | | |
|---|---|---|---|---|
| 7,133,779 | B2 * | 11/2006 | Tilke et al. ........................ | 702/9 |
| 7,558,708 | B2 * | 7/2009 | Le Ravalec-Dupin et al. . | 703/10 |
| 7,565,278 | B2 * | 7/2009 | Li et al. ............................ | 703/10 |
| 2002/0019728 | A1 * | 2/2002 | Van Bemmel et al. ........... | 703/2 |

FOREIGN PATENT DOCUMENTS

| | | |
|---|---|---|
| GB | 2294343 | 4/1996 |
| GB | 2299880 | 10/1996 |
| GB | 2322949 | 9/1998 |

OTHER PUBLICATIONS

Xu et al., "Characterizing Fracture Spatial Patterns by Using Semivariograms", Acta Geologica Sinica, vol. 76, No. 1, Mar. 2002, pp. 89-99.*
Raymond Munier, "Statistical analysis of fracture data, adapted for modelling Discrete Fracture Network—Version 2", Svensk Karnbranslehantering AB, pp. 1-60.*
Tran et al., "Integrated Conditional Global Optimisation for Discrete Fracture Network Modelling", Computers & Geosciences, vol. 32, Issue 1, Feb. 2006, pp. 17-27.*
Bourbiaux, B., et al., Fractured reservoirs modelling: a review of the challenges and some recent solutions, First Break, Sep. 2005, vol. 23, pp. 33-40.
Basquet, R., et al., Fracture Flow Property Identification: An Optimized Implementation of Discrete Fracture Network Models, 14th Society of Petroleum Engineers Middle East Oil & Gas Show and Conference, Bahrain, Mar. 2005, SPE93748, pp. 1-9.
Daly, C., et al., Characterisation and Modelling of Fractured Reservoirs—Static Model, Proc. 9th European Conference on the Mathematics of Oil Recovery, Cannes, France, 2004, A024, pp. 1-8.
Garcia, M., et al., Fast and Efficient Modeling and Conditioning of Naturally Fractured Reservoir Models Using Static and Dynamic Data, Society of Petroleum Engineers Europec/EAGE Annual Conference and Exhibition, London, Jun. 2007, SPE 107525, pp. 1-20.

(Continued)

*Primary Examiner* — Saif Alhija
*Assistant Examiner* — Herng-der Day

(57) ABSTRACT

A method of representing and using fractures in a model of a subterranean reservoir is described including the partitioning the fracture network into a discretely modeled part and a remaining statistically described part from a statistical description of all fractures, the determination of the correlation effects caused by fractures with dimensions exceeding dimension of the local grid cells and the determination of petrophysical properties while allowing for arbitrary distribution of fracture orientations, with all three aspects being combinable to improve the modeling of fractures and the simulation of fractured reservoirs.

15 Claims, 2 Drawing Sheets

OTHER PUBLICATIONS

Suzuki, S., et al., History Matching of Naturally Fractured Reservoirs Using Elastic Stress Simulation and Probability Perturbation Method, Society of Petroleum Engineers Annual Technical Conference and Exhibition, Dallas, TX, Oct. 2005, SPE 95498, pp. 1-20.

Christensen, S.A., et al., Seismically Driven Reservoir Characterization Using an Innovative Integrated Approach: Syd Arne Field, Society of Petroleum Engineers Annual Technical Conference and Exhibition, San Antonio, TX, Sep. 2006, SPE103282, pp. 1-20.

Lee, S.H., et al., Hierarchical modeling of flow in naturally fractured formations with multiple length scales, Water Resources Research, Mar. 2001, vol. 37, No. 3, pp. 443-335.

Souche, L., et al., An End-to-End Approach to Naturally Fractured Reservoir Modelling: Workflow and Implementation, EAGE?SEG Research Workshop Perugia, Italy, Sep. 2007, A33, pp. 1-5.

Zellou, A.M., et al., Fractured Reservoir Characterization Using Post-Stack Seismic Attributes—Application to a Hungarian Reservoir, EAGE 68tj Conference & Exhibition. Vienna, Jun. 2006, pp. 1-5.

Samantray, A.K., Methodology for Quantifying Subseismic Faults in Petroleum Reservoirs—Image Processing and Stochastic Simulation Examples, Thesis submitted to the Department of Geology and Mineral Resources Engineering, Norwegian University of Science and Technology, Trondhein, Norway, Nov. 1996, pp. 223-232.

Oda, M., Permeability tensor for discontinuous rock masses, Geotechnique, vol. 35, No. 4, 1985, pp. 483-493.

Kazemi, H., et al., Numerical Simulation of Water-Oil Flow in Naturally Fractured Reservoirs, Society of Petroleum Engineers Journal, Dec. 1976, SPE 5719, pp. 317-326.

Mourzenko, V.V., et al., Macroscopic permeability of three-dimensional fracture networks with power-law size distribution, Physical Review E, Issue 69, The American Physical Society, 2004, pp. 066307-1-066307-13.

Grinstead, D.M., et al., Introduction to Probability, American Mathematical Society, 1997, pp. 285-291.

Souche, L., et al., A Dual Representation for Multiscale Fracture Characterization and Modeling, AAPG International Conference, Denver, CO, Jun. 2009, pp. 1-6.

\* cited by examiner

FRACTURE NETWORK CHARACTERIZATION METHOD

FIELD OF THE INVENTION

The invention relates to methods of characterizing networks of fractures in a subterranean reservoir using a statistical description derived from logging, seismic and other well and reservoir measurements. More particularly, it relates to such a method for characterizing heterogeneity, spatial variability, anisotropy and uncertainty attached to these properties thus permitting an enhanced representation of the reservoir by computational means.

BACKGROUND

A representation of a reservoir or parts of a reservoir by computational means is an important tool for the hydrocarbon producing industry. Reservoir models are used to determine important steps in the development and production of reservoirs. The reservoir model can be seen as an interpreted and specifically formatted representation of the knowledge of the geology and petrophysical properties of the reservoir.

The commonly accepted building process and use of reservoir models includes the steps of creating first a fine-scale, detailed 3D representation of the geological objects in the volume of interest (layers, faults, etc.) and of their petrophysical properties (the geological model). This fine scale model is then typically converted into a coarser scale representation, the so-called simulation model, with its associated petrophysical properties by the way of an upscaling process. The coarse scale representation is then used for example as input for a flow simulator that computes the movements of fluid and the evolution of pressures, saturation of phases and concentrations of elements over time.

A reservoir model typically combines generic knowledge derived from general geological processes such as basin formation, deposition, diagenesis and the like with knowledge specific to the reservoir. Knowledge of the geological objects within a specific reservoir can be gained primarily from reservoir surveys covering large sections of the reservoir. Reservoir survey methods include seismic or electromagnetic surveys. The results of these primary surveys are then augmented by localized survey methods covering the vicinity of wells drilled into the reservoir. Well survey methods include the plethora of well logging methods, seismic profiling, analysis of core and cuttings, flow testing and many more. The combination of the results of reservoir surveys and localized surveys into a common frame or format of representation provides the basis for a fundamental reservoir model.

However this fundamental reservoir model (representing only the measured and interpreted data) is of limited use unless populated more densely and uniformly by interpolation and statistical methods. These methods are employed to fill gaps and associate each grid cell, which is typically the smallest unit of the mathematical description of the model, with formation properties as derived from the limited number of measurements available. It can be easily seen that this step of populating the reservoir model with interpolated or otherwise calculated parameters has the effect of vastly increasing the accuracy of the predictive capacities of the model but at the cost of increased computational resources as relating for example to data storage space and processing speed.

When defining a reservoir model, its primary geometric features or building blocks are the layers or horizons and faults, which when combined define the major segments of the reservoir from a geological point of view. But under these large scale features there are other important geological features which can have a profound impact on the fluid flow through the reservoir. One of the more important of these smaller scale features are fractures, which can be regarded as faults with little or no sliding or slip movement between the fault faces.

It is immediately obvious that the number, the size and the orientations of the fractures within a block can heavily influence the overall permeability of that block to fluid flow, potentially overriding other factors such as rock permeability and porosity, wettability etc. The ability to include an accurate discrete or statistical representation of fractures is therefore generally regarded as a very important aspect within the larger task of building a reservoir model.

When modeling the impact fractures can have on the reservoir, the fractures are most often represented by way of a discrete fracture network (DFN) in the geological model, while they are represented by their effective petrophysical properties in the (coarser) simulation model. This conventional approach is described for example in: B. Bourbiaux, R. Basquet, J. M. Daniel, L. Y. Hu, S. Jenni, A. Lange, and P. Rasolofosaon, "Fractured Reservoirs Modelling: a review of the challenges and some recent solutions", *First Break*, vol. 23, pp 33-40, September 2005. A discrete fracture network is a representation in which each individual fracture is represented by a small surface patch (in 3D) or a small polygonal line (in 2D) associated with individual geometrical and petrophysical attributes such as aperture, transmissivity, etc.

The main problem associated with the use of the discrete fracture network representation is that both the memory required to store the DFN representation and the time required to compute the corresponding effective petrophysical properties increase with the number of fractures in the network. The effective petrophysical properties are those quantities which describe the impact of fractures on the physical properties of rocks (e.g. porosity and permeability) at a coarser scale. These properties are commonly assigned to the elementary blocks or volumes of rocks (the grid cells) that, together, form a partition of the volume of interest (the grid).

Several solutions have been proposed to overcome the computational limitations associated with DFN models. All these solutions rely on a simplification of the geological model, and result in a degradation of the corresponding simulation model.

The most popular method, as described for example in: R. Basquet, C. E. Cohen and B. Bourbiaux, "Fracture Flow Property Identification: An Optimized Implementation of Discrete Fracture Network Models", Proc 14th MEOS, 2005, or in: Daly and D. Mueller, "Characterization and Modeling of Fractured Reservoirs: Static Model", *Proc*. ECMOR, 2004 uses instead of a full 3D model a reduced 2.5D model (i.e. a layered 2D fracture network). While this method greatly reduces both computational time and required memory, 2D models provide a poor representation of non layer-bound fractures and cannot model properly fracture basements. Garcia et al. in: M. Garcia, F. Gouth and O. Gosselin, "Fast and Efficient modeling and conditioning of naturally fractured reservoir models using static and dynamic data", Europec/EAGE ACE, 2007 use a local 2.5D periodic model to represent the detailed fracture network while minimizing the computational cost. While it allows modeling accurately complex relationships between fracture sets, it assumes the existence of a representative elementary volume and may lead to a poor representation of large scale fractures.

Another technique uses the DFN only for local models, in the vicinity of the wells, and interpolates the upscaled effective properties to obtain the full-field model. The disadvantage of these methods is that they do not allow for controlling correctly the model variability in the inter-well space. Basquet et al. as cited above propose to upscale the fine-scale DFN to a coarser discrete model with similar flow behavior. However, the loss of physical realism that is due to the upscaling makes it impossible to validate the quality of the coarse model.

An alternative solution to describing the fractures as DFN is to omit it entirely and use directly an effective medium model as demonstrated in: S. Suzuki, C. Daly, J. Caers, D. Mueller, "History Matching of Naturally Fractured Reservoirs Using Elastic Stress Simulation and Probability Perturbation Method", Proc. SPE ATCE, 2005 and S. A. Christensen, T. E. Dalgaard, A. Rosendal, J. W. Christensen, G. Robinson, A. M. Zellou, T. Royer, "Seismically Driven Reservoir Characterization Using and Innovative Integrated Approach: Syd Arne Field", Proc. SPE ATCE, 2006. Suzuki et al. compute directly the permeability from the fracture density, assuming a power-law correlation with the distance to the percolation threshold. This method does not take into account the actual geometry of the fracture network and assumes that all the flowing fractures are locally aligned in the same direction. Christensen et al. use a similar approach, relying on 3D fracture density maps derived from seismic attributes and structural attributes. However, the fracture geometry is not fully described by the geological fracture model and the authors do not propose any explicit method to upscale its permeability.

Finally, some authors, such as Lee, S. H., M. F. Lough, and C. L. Jensen (2001), "Hierarchical Modeling of Flow in Naturally Fractured Formations with Multiple Length Scales", Water Resour. Res., 37(3), pp. 443-455, use a mixed representation combining large discrete fractures with an effective representation of the medium. But this mixed representation is restricted to the coarse simulation model, and a DFN is still required to compute the properties of the effective properties.

In the light of the known methods it is seen as an object of the present invention to provide a novel method of representing fractures in a reservoir model and modeling accurately the heterogeneity, spatial variability, anisotropy and uncertainty attached to the effective petrophysical properties derived therefrom while minimizing the memory space required by the numerical data structures used for representing the fracture network and maximizing the speed of the algorithms used for computing these.

SUMMARY OF INVENTION

This invention relates to methods of improving the representation of fractures as determined by various geological, geophysical and/or geochemical survey methods such as seismic images, borehole logging and image data, production data, drilling events and cutting and core analysis within model of the reservoir. The methods include at least three novel aspects which can be used either separately or in any combination to reduce the storage space required for storing the model, to take into account special correlation as caused by the fractures which exceed the boundaries of the subunits or grid cells of the model and or improve the calculation of petrophysical parameters by taking into account arbitrary orientations of the fractures.

Hence according to a first aspect of the invention there is provided a method of representing fractures in a model of a subterranean reservoir based on a partition of a statistical description of a full fracture network as obtained from evaluation of geological, geophysical and/or geochemical measurements within the reservoir into a first part to be represented by a discrete fracture network and into a second part to remain represented by a modified statistical description.

A statistical description of a fracture network is represented within the scope of the present invention by the value and spatial variation of at least one of fracture density, size distribution of the fracture, distribution of fracture orientations and distribution of fracture apertures and/or permeability and/or transmissibility. For a more complete description of the reservoir it is advantageous to include into the statistical description fracture density, size distribution of the fracture, distribution of fracture orientations and distribution of fracture apertures or any of their equivalent representations.

It is important to note that the partition is effected from a (original) statistical description of the fracture network and not from an originally discrete description of the fractures as per known methods.

The partitioning shifts the fractures which are expected to have the greatest impact on the reservoir connectivity or permeability into the part described by the discrete fracture network. The limits which determine whether a fracture is to be modeled as part of the DFN or remain described by a truncated statistical representation can be based on any of the size of the fracture, the permeability of the fracture, a maximum number of fractures to be included into the discrete fracture network or a maximum proportion of a total fracture density to be included into the discrete fracture network. The selection process and the limits can be controlled by a human operator or initiated and set automatically by means of a computerized control program determined for example by the available storage space, or desired accuracy.

According to a second aspect of the invention, there is provided a method of representing fractures in a model of a subterranean reservoir, where a parameter representative of spatial correlation as caused by the size of fractures in the network in relation to the size of cells of the model is derived from a statistical description of a fracture network as obtained from evaluation of geological, geophysical and/or geochemical measurements within said reservoir. The parameter can be for example a semivariogram or any equivalent thereof.

According to a preferred embodiment of this aspect, the parameter is determined as a function of the variance of a fracture density and a proportion of fractures which intersect with a volume at a location (u) of the model and a volume at a different location (u+h) separated by a distance h. Both the variance and the proportion of fractures can be determined from the statistical description of the fracture network.

According to a third aspect of the invention, there is provided a method of deriving one or more petrophysical parameters from a model of a subterranean reservoir including a statistical description of fractures in a model, including the step of deriving from the statistical description of the fracture network as obtained from evaluation of geological, geophysical and/or geochemical measurements within said reservoir one or more petrophysical parameters using a known but arbitrary orientation distribution of the fractures in the network.

Preferably the orientation distribution is classified and a means of the distribution is defined and determined as per the classification. The effective value is then derived from a numerical or analytical integration over the means.

These and other aspects of the invention are described in greater detail below making reference to the following drawings.

DETAILED DESCRIPTION

Figure 1:
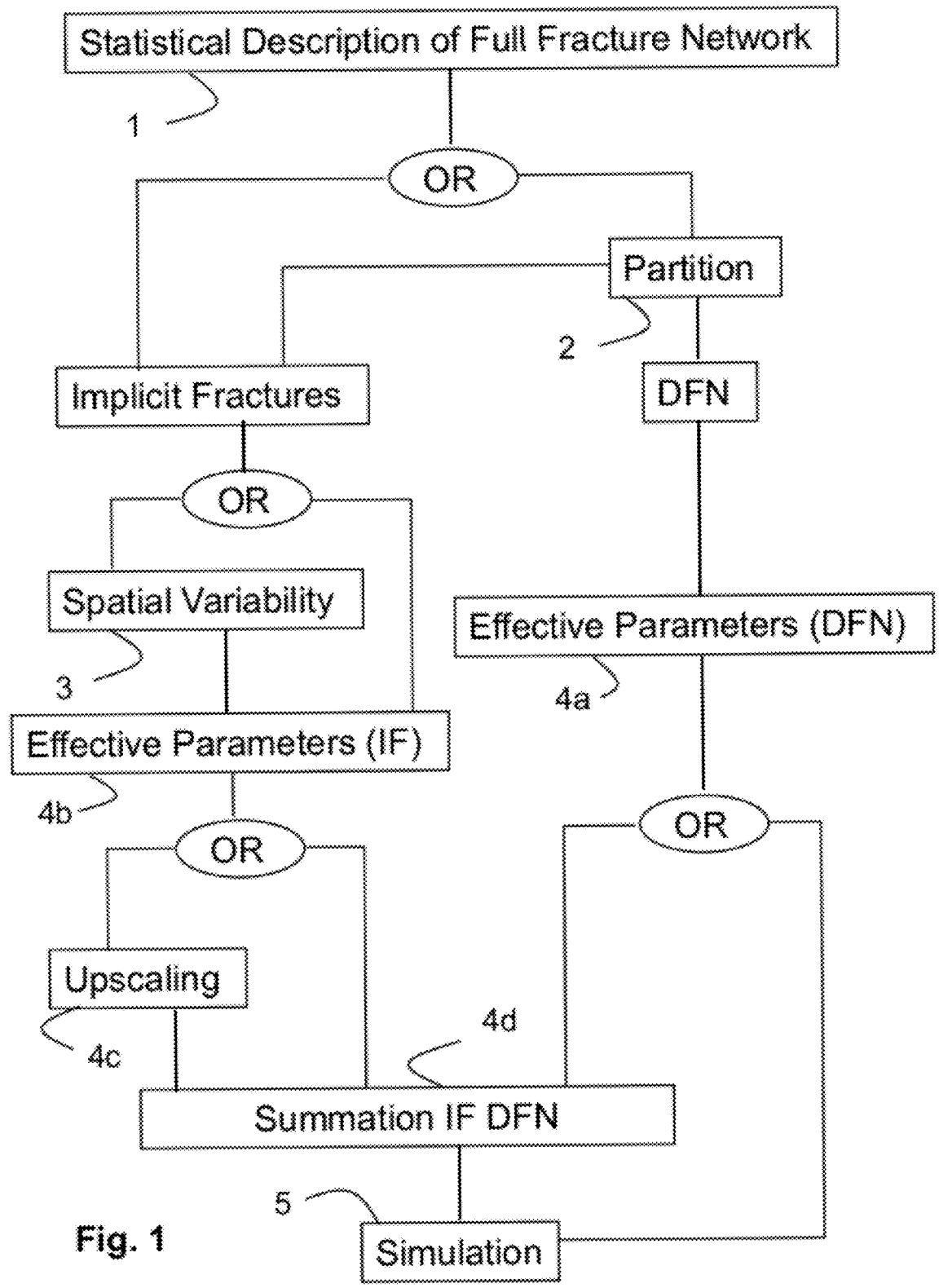
FIG. 1 lists steps in accordance with an example of the invention in a flowchart.

An example of the novel methods is described by the following steps following the flowchart of FIG. 1. In particular, the example includes as Step 1 the creation of a statistical description of the full fracture network. In the optional Step 2 of the example, the statistical description is partitioned into part which is modeled by a Discrete Fracture Network (DFN) and a part which is maintained as statistical description, referred to herein below as implicit fractures. The implicit fractures, i.e. the part kept as statistical description can then be optionally analyzed for heterogeneity and spatial variability of the fracture density. After this step 3, petrophysical parameters are derived from both the DFN part (Step 4a) and the implicit fractures (Step 4b).

In step 5, the petrophysical parameters derived for the DFN and the implicit fractures are shown to serve as input to the reservoir simulator either directly and separately or combined (Step 4d). Before being used as input to any simulator, the parameters may be upscaled to a coarser grid (Step 4c).

The above steps are described in detail in the following sections maintaining the numerals as part of the section headings.

(1) Creating a Statistical Description of the Full Fracture Network

The process of extracting a consistent statistical description of the geometry and properties of the fracture network is part of the conventional fracture characterization workflow. It mainly consists of extracting statistics about the orientation, density, aperture and permeability from all available data (e.g. seismic images, borehole image data, production logs, drilling events, etc.) and in integrating all these data in a 3D model of the subsurface. Examples of how this process can be performed in detail are described for example in: L. Souche and M. Rotschi "An End-to-End Approach to Naturally Fractured Reservoir Modeling: Workflow and Implementation" Proc. SPE/EAGE Workshop on Fractured Reservoirs, Perugia, 2007 and A. M. Zellou, T. Royer, G. C. Robinson, P. Zahuczki, A. Kirali, "Fractured Reservoir Characterization Using Post-Stack Seismic Attributes—Application to a Hungarian Reservoir", Proc. 68th EAGE Conference and Exhibition, 2006.

In this process, the density of each fracture set, which can be expressed in terms of number of fractures per unit volume (P30), length of fracture per unit volume (P31) or area of fracture per unit volume (P32) is generally interpolated on a volume mesh (the reservoir grid), constrained by well observations and optionally following a 3D trend computed from seismic and structural data. The interpolated values actually represent the expected values of the fracture density in the corresponding grid cells. The fracture density can also be expressed in terms of fracture spacing (average length of the interval between fractures measured in the direction normal to the mean orientation of the fracture planes).

Besides the fracture density whether expressed as P30, P31, P32 or fracture spacing, a statistical description of the fracture network includes further parameters and their spatial variations:

Distribution of the size of the fractures (e.g. length, area, etc.)

Distribution of fracture orientations

Distribution of fracture apertures and/or permeability and/or transmissibility. Under some assumptions on the geometry of the fracture faces, these quantities can be deduced from each other computationally. For example, assuming that the flow in the fracture plane can be represented by the equivalent Poiseuille flow between two parallel plates yields a linear relationship between the permeability of a fracture and the square of its aperture.

It is to be understood that a constant value is just a specific type of distribution. It is also to be understood that the P30, P31 and P32 fracture densities can be computed from each other provided the distribution of fracture sizes is known. Similarly, P32 fracture density can be computed from fracture spacing provided the distribution of fracture orientation is known. For example, it can be shown that if the fractures are described by small rectangles with a distribution of length L and a constant aspect ratio r, then the P31 and the P32 are linked by the following relationship:

$$P31 = rE(L)/(\text{Var}(L) + E(L)^2) P32,$$

where E( ) represents the expected value of the distribution and where Var( ) represents its variance.

The spatial variations of the parameters can be described either analytically, as a function of geographical coordinates such as mean_fracture_density=$3*(x-x\_0)+1.5*(y-y\_0)^2+(z-z\_0)$, where (x,y) represent horizontal coordinates longitude and latitude and where z represents reservoir depth), or by arrays of values attached to elementary volumes of a geometrical partition of the area or volume of interest (a grid).

(2) Creating a Discrete Fracture Network (DFN)

The DFN created in this optional step comprises the fractures which are expected to have the greatest impact on the reservoir connectivity or permeability. While the process of creating a discrete fracture network from a statistical description of this network per se is described in the literature such Souche and Rotschi cited above, the proposed process creates a discrete fracture network that corresponds to only the portion of the fracture network that is expected to have a significant impact on the large scale reservoir connectivity, and to create or maintain a (truncated) statistical description of the remaining portion of the network.

The portion of the fracture network that is expected to have the greatest impact on the reservoir connectivity is identified by the user or as part of an automated selection process based for example on a function of the distribution of size and/or of permeability of the fractures. One possible selection criteria can be the condition to incorporate into the DFN all the fractures that are larger than an arbitrary threshold size and/or that are more permeable than an arbitrary threshold permeability. Both thresholds can be constant or may vary from one place to another in the reservoir. As an example for the latter, the threshold fracture size can be fixed as a linear function of the size of the cells of the simulation grid, with values for the linear coefficient typically ranging from 0.5 to 5.

Assuming that the simulation grid is composed of hexahedral cells with a size of 100 m×100 m horizontally, then all the fractures with a maximum horizontal dimension larger than 150 m could be selected to be represented in the DFN. From the cumulative distribution law of the fracture length, the system computes the proportion of fractures that will be represented by the DFN. From this proportion and the known P30 density of the network, the system computes how many fractures should be represented by the DFN and creates it using known algorithms such as the so-called marked point process as described for example in: Ajay Kumar Samantray, "Methodology for Quantifying subseismic faults in petroleum reservoirs, image processing and stochastic simulation examples", PhD Thesis, NTNU Trondheim, pp. 223-232, 1995.

Alternatively, the number of fractures to be included into the DFN can be provided directly as input. Given the fracture size and/or permeability distribution laws, this number translates into corresponding thresholds for fracture size and/or fracture permeability. If a user or the system specifies that 1000 fractures should be included in the DFN together with the condition that the fracture selection is to be based on their size, the total number of fracture is computed from the P30 fracture density and from the total volume of the model. The proportion of fractures to be represented as a DFN is then computed. The threshold size is then deduced from this proportion and from the inverse cumulative distribution law of fracture size. 1000 fractures with size greater than the computed threshold size are then created using an algorithm such as those described in literature (e.g. the marked point process).

In a further alternative for the selection criterion, the proportion of the total fracture density to be represented can be chosen. If it is for example specified that the DFN are to represent 10% of the total P30 fracture density and that the selection of the fractures is to be based on their size only, the total number of fractures is computed from the P30 fracture density and from the total volume of the model. The number N of fractures to be simulated is computed from this proportion and from the total P30. The threshold size is then deduced from the selected proportion and from the inverse cumulative distribution law of fracture size. N fractures with size greater than the computed threshold size are then created using an algorithm such as those described in literature (e.g. the marked point process).

The implicit fractures, i.e. the fractures that are not represented through the DFN, are represented by a portion of the original statistical model. The truncated statistical model can be regarded as being in most aspects similar to the original statistical description of the whole network, but modified to take into account the fractures which are no longer represented. The fracture density represents for example only the portion of the fractures that are not represented in the DFN. It is obtained by deducing the DFN fracture density from the total fracture density. The size and/or permeability distributions are truncated to represent only the remaining fractures of the network. The truncation thresholds are determined through the process described in the section above.

(3) Extracting Heterogeneity and Spatial Variability

During this optional step, the heterogeneity and spatial variability of the fracture density is extracted from the statistical description of the fracture network. In the present example, the description is the description of the implicit fractures left after extracting the DNF. However, the steps as described in the following can be applied equally to a full, untruncated statistical description of the whole fracture network as created in Step 1 above.

As mentioned previously, at any location of the model, the fracture density is uncertain and the value given by the statistical parameters computed in Step 1 actually represents the expected value of the distribution. But fractures have features like size or dimensions extending beyond the borders of a single grid cell. The effect of these features is the introduction of a spatial correlation structure in the P32 fracture density of any stochastic realization of the fracture network when represented at the scale of the grid. The stochastic realization assigns an expected value of a parameter to a grid cell, for example permeability, within the constraints set by the statistical representations of the fractures. Without properly considering the spatial correlation, the stochastic realization may results in an inaccurate expected value. This spatial correlation depends on both the distributions of fracture length and of fracture orientation and is herein represented as semivariogram $\gamma(h)$.

In known methods, the semivariogram $\gamma(h)$ is typically calculated from the DFN by analyzing the discrete fracture in each grid cell. For the present invention, it was found that the semivariogram $\gamma(h)$ can be alternatively derived from the statistical representation of a fracture network, including the representation of the implicit fractures.

For example, the semivariogram $\gamma(h)$ of P32 fracture density $Z(x)$ can be computed as a function of the variance of $Z(x)$, $Var(Z(x))$, and the proportion of fractures $p(h)$ which intersect with a volume at a location (u) and a volume at location (u+h) (where u is a representative elementary volume element such as a grid cell and h is a 3D vector representing the direction and distance between two points or cells or the model. Using these parameters $\gamma(h)$ can be calculated as $\gamma(h)=(1-p(h))^2 * Var(Z(x))$.

It is important to note that in the example $\gamma(h)$ is derived from $p(h)$ and $Z(h)$ which in turn follow immediately from the statistical description of the network. The "overshoot" parameter $p(h)$ can be estimated by numerical or analytical integration from the probability density functions of the fracture length and of the fracture orientation. For example, an approximation of $p(h)$ can be obtained by computing the proportion of fractures which length l is greater than the norm of h and which orientation is within an angle $\alpha(l)$ from h, $\alpha(l)$ being defined as $\alpha(l)=a \sin(D/2l)$, with D the size of a representative elementary volume (e.g. a cell grid). And the estimation of $Var(Z(x))$ depends on the definition of fracture density. For example, if the fracture density is assumed to follow a Poisson distribution, the input P32 can directly be used as an estimate of the variance.

Figure 2A:
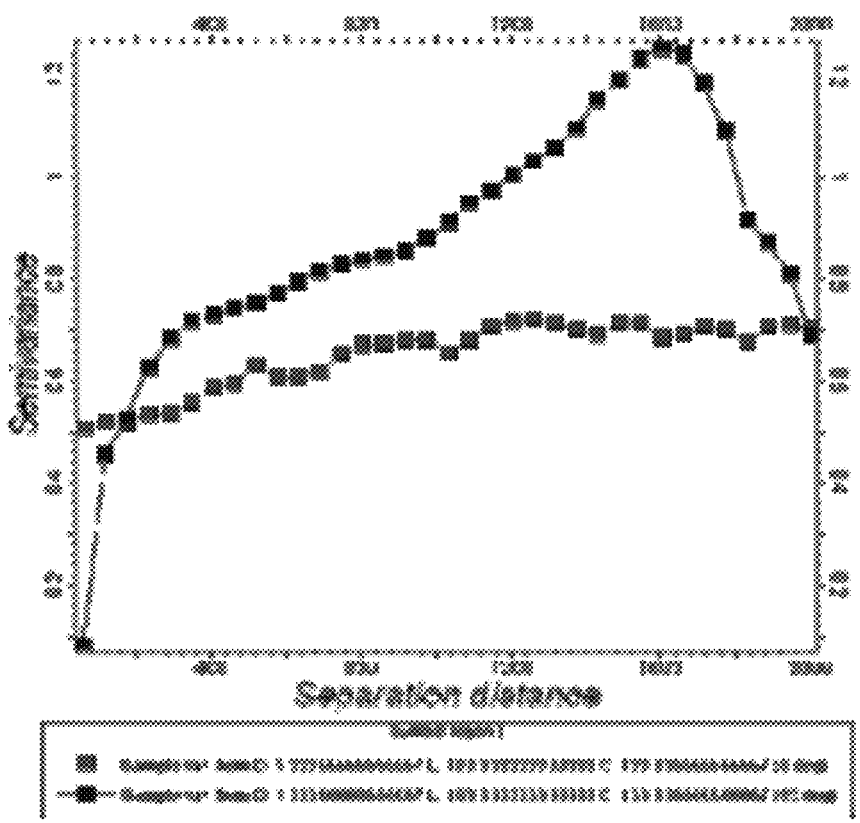
FIGS. 2A and 2B illustrate the calculation of variograms in accordance with one aspect of the invention.
Figure 2B:
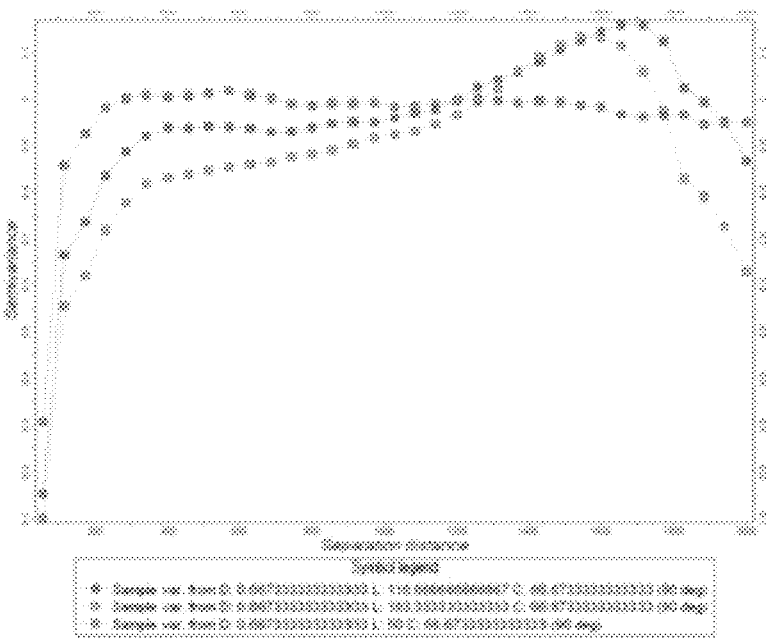

In FIGS. 2A and 2B, there are shown results of the calculation of the normalized semivariance (as ordinate) as a function of the length of the distance vector h (as abscissa). In the case of FIG. 2A, the two graphs represent orthogonal orientations of the vector h at equal values of fracture density and length. Two points can be considered as not being correlated as soon as the semi variance reaches a plateau. The graph representing a 0 degree orientation reaches a plateau virtually immediately, indicating a very small correlation length in that direction. The second graph representing a 90 degrees orientation has a less steep slope indicative of larger correlation length.

The three graphs of FIG. 2B illustrate the case of fracture networks with equal density and orientation but three different mean fracture lengths. It can be observed that the correlation length growth with the increasing fracture as expected.

Considering the above example of a statistical description of the truncated fracture network, the step of calculating a semivariogram may be omitted in cases where, for example, the length limit between DFN and implicit fractures is not significantly longer than the size of the grid cell or, in a more general case, if most of the fractures (e.g. more than 75% of the P32 density) are smaller than the size of a simulation grid cell.

In the following sections it is described in detail and by making reference to the Appendix "Mean porosity, mean permeability tensor of the continuous fracture model" attached to this description, how to derive effective petrophysical parameters, in particular from the continuous or statistical description of the fracture network. The method followed herein can be regarded as an extension of the expression presented in: M. Oda, "Permeability Tensor for Discontinuous Rock Masses". Geotechnique, 35 p. 483-495, 1985.

For each grid cell, the fracture porosity is simply the sum of the volume of the fractures contained in a grid cell divided by the volume of the cell. A third petrophysical property besides fracture permeability and fracture porosity property that can be computed allows the quantification of exchanges between the formation or rock matrix and the fractures. This parameter is often referred to as "sigma factor" in the literature. Its computation can, for example, be based on the formula proposed in: H. Kazemi, L. S. Merrill, K. L. Porterfield and P. R. Zeman, "Numerical Simulation of Water-Oil Flow in Naturally Fractured Reservoirs", SPE Journal, December 1976 for a full three-dimensional case, or from any generalization of that formula.

The standard formula as used by Oda implies that all the fractures are perfectly connected in the fracture network. However, a multiplicative factor between zero and one can be applied to the permeability computed using this formula to take the actual connectivity of the network into account. Such a multiplicative factor can be computed directly from a statistical description of the complete fracture network, for example according to the principles described in: V. V. Mourzenko, J.-F. Thovert, and P. M. Adler, "Macroscopic permeability of three-dimensional fracture networks with power-law size distribution", Physical Review E 69, 066307, 2004. The same factor should be applied to the calculations of permeability for the DFN and for the implicit fractures.

The following steps are part of the derivation of the effective petrophysical parameters for the DFN and the statistically described implicit fractures. It is important to note that the derivation of the parameters follows the same principles and differs only in the way the expected value is calculated. This ensures that the results for both parts of the network can be readily combined for the subsequent simulations.

(4a) Computation of Petrophysical Properties of the DFN

For the portion of the network that is represented by discrete fractures, the computation of both porosity and permeability consists in a summation, within each grid cell, over the fractures that cross the grid cell. This process is well described in literature cited above. Alternatively, instead of computing effective petrophysical properties, the DFN can be integrated, in part or in full, directly as explicit elements in the flow-simulation grid using for example the CONFRAC function ECLIPSE™, a commercially available flow simulator.

(4b) Computation of Petrophysical Properties of the Implicit Fractures.

The more interesting case within the scope of this invention is the computation of the petrophysical properties of the part of the network that is represented by implicit fractures. The present example uses two alternative methods. In the first method, the expected values of the effective petrophysical properties are determined, while the alternative includes the calculation of stochastic realizations.

Using the example of permeability as the petrophysical property to be determined, the calculation of the expected value of the effective petrophysical properties includes the step of computing the expected value of each component of the permeability tensor. Whilst in the case of a DFN this process is a direct summation over the discrete fractures in the cell, an analytical or numerical integration over the probability density function of fracture orientation is used in case of the implicit fractures. The derivation of the respective expression and means is described in the Appendix, which describes for the permeability tensor, how the equation for the discrete case as introduced by Oda above, can be rewritten into an expression of means without changing the underlying physical assumptions made by Oda.

The Appendix further provides the analytical expression for the means to be evaluated by assuming a given distribution law, such as exponential distribution, log normal distribution, power law distribution, and Gaussian distribution for the permeability and aperture of the fractures and Kent spherical distribution, Fisher spherical distribution, or Bingham spherical distribution for the orientations of the fracture. The appropriate choice of these possible distributions can be derived directly from measured data such as a statistical evaluation of the images of fractures as provided by tools such as Schlumberger's FMI™ logging tool.

If, for example, the permeability of the fracture is assumed to be proportional to the square of its aperture (Poiseuille flow assumption), then the expected value of the product of aperture and permeability is computed as a linear function of the 3rd raw moment of the probability distribution of the fracture aperture.

The above described calculation of the expected value of the effective petrophysical properties is expected to produce acceptable results when most of the fractures (e.g. more than 75% of the P32 density) are smaller than the size of a simulation grid cells. Otherwise or generally, it may be advantageous to determine stochastic realizations of effective petrophysical properties, as described using several possible variants in the following.

First, a stochastic realization of the P32 fracture density is computed, which is then used for computing the effective petrophysical properties.

For performing a stochastic simulation of fracture density constrained by its probability distribution function and by its semi-variogram, several methods can be used including for example either standard geostatistical algorithms as described in literature, such as for example sequential Gaussian simulation with trend (if, once the trend removed, the P32 distribution function is spatially constant and can be transformed to a Gaussian distribution using a normal-score transform). In other case the so-called p-field method may be applied using an unconditional simulation based on the semi-variogram and the cumulative distribution function of the P32 density.

Alternatively, instead of using traditional geostatistics, image processing can be used without computing the semi-variogram. This method is based on performing an image convolution between a random field representing the uncorrelated P32 fracture density and a kernel representing p(h) (the probability that a fracture going through the center x of the kernel also goes through a point located at x+h, h being a 3D vector). The final value vf(x0) at the grid cell x0 would then be vf(x0)=1/sum(p(h_i)*sum_i(p(h_i)vi(xi))) with vi(xi) being the value of the uncorrelated random field at point xi.

If the values of fracture density can be considered as spatially uncorrelated (under the length conditions described above), a stochastic realization of P32 density can be used by picking, for each grid cell, a Monte-Carlo sample from the cumulative distribution function of the P32.

After the stochastic realization of the P32 fracture density is computed, several methods can be used to determine the effective petrophysical properties including the method of Monte-Carlo sampling and the method of the convolution of probability distribution functions.

When applying Monte-Carlo sampling, the expected values of fracture aperture and permeability are picked from their respective probability distribution function using a Monte-Carlo sampling method instead of using the formula proposed in Oda. If the permeability of the fracture is assumed to be proportional to the square of its aperture (Poiseuille flow assumption), then the Monte-Carlo sampling is performed in the random variable representing the cube of the fracture aperture. A Monte-Carlo sampling method is also used to pick the orientation-dependant term of the permeability tensor. A discrete sum, similar to the one used for computing DFN permeability, is performed over the Monte-Carlo samples. The number of Monte-Carlo samples summed to compute the permeability is a function of the P30 fracture density and of the volume of the cell. Similarly, the effective porosity is computed as the product of the arithmetic mean of Monte-Carlo samples of fracture aperture and of a stochastic realization of the P32 fracture density.

Instead of using Monte-Carlo sampling, similar results can be achieved from a convolution of the probability distribution function and by computing analytically or numerically the probability distribution function of the sum of the apertures, permeabilities, etc. of the fractures, and then picking a single Monte-Carlo sample from this distribution. For a cell crossed by n fractures, the sum of n independent random variables representing e.g. the distribution of fracture aperture can be computed as the n-fold convolution of the probability density functions. Basic mathematical principles of analytical computation of the sum of random variables using such an n-fold convolution are described in: C. M. Grinstead, J. L. Snell, "Introduction to Probability", American Mathematical Society Publ. 2nd Ed. pp. 285-291, 1997.

It should be noted that the Monte-Carlo sampling method and the Convolution method can be used together in various combinations, for example by applying the Convolution method to fracture aperture and permeability and the Monte-Carlo sampling method to fracture orientation.

The following two steps describe the optional upscaling and summation of the petrophysical parameters as derived above separately for the case of the DFN and the implicit fractures.

(4c) Upscaling of the Effective Properties Coming from the Implicit Fractures to the Simulation Grid For optimal performance, the DFN effective properties should be upscaled directly to the coarse simulation grid. The effective properties corresponding to the implicit fractures must be upscaled on the grid on which the statistical description of the network was defined (e.g. the one supporting the fine geological model). If that grid is different from the coarse simulation grid, the effective properties of implicit fractures should be upscaled to the simulation grid before they can be combined with those of the DFN. Standard upscaling algorithms (directional averaging, flow-based upscaling, etc.) can be used to upscale the effective properties coming from the implicit fractures to the simulation model.

(4d) Summation of Properties Coming from the DFN and from the Implicit Fractures.

As shown in FIG. 1, the results of the calculation of the effective petrophysical properties as derived for the DFN and the implicit fracture can be used directly as inputs into the simulation stage (Step 5). If the results are however not fed directly as inputs into the simulator, the effective petrophysical properties of the DFN can be combined with those of the implicit fractures in the simulation model prior to the simulation stage.

In this process, the total fracture porosity can be calculated as the sum of the porosities of the DFN and of the implicit fractures. Assuming that the DFN and the implicit fractures are two networks that conduct flow in parallel, their permeabilities can also be summed to obtain the total permeability. The total sigma factor can be computed as $$\sigma_{total} = \sigma_{DFN} + \sigma_{implicit} + 2(\sigma_{DFN}\sigma_{implicit})^{**}1/2.$$

While the invention is described through the above exemplary embodiments, it will be understood by those of ordinary skill in the art that modification to and variation of the illustrated embodiments may be made without departing from the inventive concepts herein disclosed. Moreover, while the preferred embodiments are described in connection with various illustrative processes, one skilled in the art will recognize that the system may be embodied using a variety of specific procedures and equipment and could be performed to evaluate widely different types of applications and associated geological intervals. Accordingly, the invention should not be viewed as limited except by the scope of the appended claims.

What is claimed is:

1. A method of representing fractures and computing a petrophysical parameter for a simulation model of a subterranean reservoir, said method comprising:
providing, to a processor, measurements that characterize the subterranean reservoir to derive a statistical description of a full fracture network of the subterranean reservoir;
partitioning the statistical description of the full fracture network based at least in part on a criterion;
based on the partitioning of the statistical description of the full fracture network, creating, and storing to a storage device, a discrete fracture network for a portion of the full fracture network;
computing the petrophysical parameter using the stored discrete fracture network and at least a portion of the statistical description of the full fracture network or separately computing the petrophysical parameter using the stored discrete fracture network and using at least a portion of the statistical description of the full fracture network wherein the computing and separately computing using the at least a portion of the statistical description of the full fracture network comprise calculation of stochastic realizations of one or more random variables representing the petrophysical parameter, in part, by deriving a spatial correlation parameter with respect to a separation distance using, from at least a portion of the statistical description of the full fracture network, fracture density and probability density functions of fracture length and of fracture orientation.

2. The method in accordance with claim 1, wherein the discrete fracture network comprises fractures of the full fracture network expected to have the greatest impact on the reservoir connectivity or permeability.

3. The method in accordance with claim 1, wherein the criterion is based on at least one parameter selected from a group consisting of size of the fracture, permeability of the fracture, maximum number of fractures to be included into said discrete fracture network, and maximum proportion of a total fracture density to be included into said discrete fracture network.

4. The method in accordance with claim 1, wherein the statistical description of the full fracture network comprises values and spatial variations of fracture density, of size distribution of fractures, of distribution of fracture orientations and of distribution of fracture apertures.

5. The method in accordance with claim 1, wherein the statistical description of the full fracture network comprises values and spatial variations of parameters representative of fracture density, size distribution of the fractures, distribution of fracture orientations and distribution of fracture apertures.

6. The method in accordance to claim 1 wherein the separation distance comprises a grid cell to grid cell separation distance for grid cells of the simulation model.

7. The method in accordance to claim 1 further comprising deriving from the at least a portion of the statistical description of the full fracture network the petrophysical parameter while allowing for an arbitrary orientation distribution of the fractures in the at least a portion of the statistical description of the full fracture network.

8. The method of claim 1 wherein the criterion comprises a spatially variable criterion.

9. The method of claim 8 wherein the spatially variable criterion accounts for well and inter-well space of the simulation model.

10. The method of claim 1 wherein the criterion comprises a criterion that depends at least in part on fracture permeability.

11. A method of representing fractures for computing one or more petrophysical parameters for a simulation model of a subterranean reservoir, said method comprising:

providing, to a processor, measurements that characterize the subterranean reservoir to derive, and store to a storage device, a statistical description of a fracture network;

based at least in part on the stored statistical description of the fracture network, deriving a parameter representative of spatial correlation as caused by size of fractures in the fracture network in relation to size of grid cells of the simulation model wherein the parameter is a function of a variance of a fracture density and a proportion of fractures which intersect grid cells separated by a distance h; and computing the one or more petrophysical parameters based at least in part on the derived parameter representative of spatial correlation.

12. The method in accordance with claim 11, wherein the parameter is a semivariogram.

13. The method in accordance with claim 11, wherein the variance of the fracture density and the proportion of fractures intersecting grid cells separated by the distance h are derived from the statistical description of the fracture network.

14. A method of deriving petrophysical parameters for a simulation model of a subterranean reservoir, the method comprising:

providing, to a processor, measurements that characterize the subterranean reservoir to derive, and store to a storage device, a statistical description of a fracture network that comprises fewer than all fractures of a full fracture network of the subterranean reservoir; and based at least in part on the stored statistical description of the fracture network, computing the petrophysical parameters while allowing for an arbitrary orientation distribution of the fractures in the fracture network wherein the computed petrophysical parameters comprise stochastic realizations of random variables and wherein the computing comprises, in part, deriving a spatial correlation parameter with respect to a separation distance using, from at least a portion of the stored statistical description of the fracture network, fracture density and probability density functions of fracture length and of fracture orientation.

15. The method in accordance with claim 14, comprising integrating numerically or analytically over the probability density functions of fracture length and of fracture orientation.

* * * * *